US011767451B2

(12) United States Patent
Watanabe

(10) Patent No.: US 11,767,451 B2
(45) Date of Patent: Sep. 26, 2023

(54) THERMALLY CONDUCTIVE MOISTURE-CURABLE RESIN COMPOSITION AND CURED PRODUCT THEREOF

(71) Applicant: THREEBOND CO., LTD., Tokyo (JP)

(72) Inventor: Kentaro Watanabe, Tokyo (JP)

(73) Assignee: THREEBOND CO., LTD., Tokyo (JP)

( * ) Notice: Subject to any disclaimer, the term of this patent is extended or adjusted under 35 U.S.C. 154(b) by 219 days.

(21) Appl. No.: 16/956,393

(22) PCT Filed: Feb. 5, 2019

(86) PCT No.: PCT/JP2019/004007
§ 371 (c)(1),
(2) Date: Jun. 19, 2020

(87) PCT Pub. No.: WO2019/159753
PCT Pub. Date: Aug. 22, 2019

(65) Prior Publication Data
US 2021/0087442 A1    Mar. 25, 2021

(30) Foreign Application Priority Data
Feb. 15, 2018 (JP) ................................ 2018-024688

(51) Int. Cl.
| | |
|---|---|
| *C09J 171/00* | (2006.01) |
| *C09J 5/00* | (2006.01) |
| *C09J 11/04* | (2006.01) |
| *C09K 5/14* | (2006.01) |
| *H05K 7/20* | (2006.01) |
| *C09D 201/10* | (2006.01) |
| *C08K 5/54* | (2006.01) |

(52) U.S. Cl.
CPC .............. *C09J 171/00* (2013.01); *C08K 5/54* (2013.01); *C09D 201/10* (2013.01); *C09J 5/00* (2013.01); *C09J 11/04* (2013.01); *C09K 5/14* (2013.01); *H05K 7/2039* (2013.01); *C09J 2203/326* (2013.01); *C09J 2471/00* (2013.01); *C09J 2483/00* (2013.01)

(58) Field of Classification Search
CPC .......... C09J 171/00; C09J 5/00; C09J 11/04; C09J 2203/326; C09J 2471/00; C09J 2483/00; C09D 201/10; C09K 5/14; C08K 5/54; H05K 7/2039
USPC ........................................................ 361/708
See application file for complete search history.

(56) References Cited

U.S. PATENT DOCUMENTS

| | | | |
|---|---|---|---|
| 5,093,389 A | 3/1992 | Shimizu | |
| 2005/0288415 A1 | 12/2005 | Beers et al. | |
| 2006/0228542 A1* | 10/2006 | Czubarow | H01L 23/3737 |
| | | | 428/521 |
| 2009/0018260 A1 | 1/2009 | Correia et al. | |
| 2015/0183951 A1* | 7/2015 | Bhagwagar | C08K 3/22 |
| | | | 524/430 |
| 2016/0086713 A1* | 3/2016 | Iwata | H01F 27/06 |
| | | | 252/78.3 |

FOREIGN PATENT DOCUMENTS

| | | |
|---|---|---|
| JP | S59-25837 A | 2/1984 |
| JP | H02-238045 A | 9/1990 |
| JP | H03-210367 A | 9/1991 |
| JP | H04-93359 A | 3/1992 |
| JP | 2004-018695 A | 1/2004 |
| JP | 2007-262140 A | 10/2007 |
| JP | 2008-504407 A | 2/2008 |
| JP | 2010-171129 A | 8/2010 |
| JP | 2010-209205 A | 9/2010 |
| JP | 2010-533236 A | 10/2010 |
| JP | 2016-210832 A | 12/2016 |
| WO | 2011/089987 A1 | 7/2011 |

OTHER PUBLICATIONS

PCT, International Search Report for the corresponding patent application No. PCT/JP2019/004007, dated Apr. 16, 2019, with English translation.
PCT, Written Opinion of the International Searching Authority for the corresponding patent application No. PCT/JP2019/004007, dated Apr. 16, 2019.
CNIPA, Office Action for the corresponding Chinese Patent Application No. 201980009190.4, dated Dec. 16, 2021, with English translation
Office Action for the corresponding Japanese Patent Application No. 2020-500412, dated Nov. 1, 2022, with English translation.
Office Action for the corresponding Japanese Patent Application No. 2020-500412, dated Jan. 10, 2023, with English translation.

\* cited by examiner

*Primary Examiner* — Ruiyun Zhang
(74) *Attorney, Agent, or Firm* — LUCAS & MERCANTI, LLP

(57) ABSTRACT

The purpose of the present invention is to provide a thermally conductive moisture-curable resin composition which develops excellent thermal conductivity and peelability after curing.
The thermally conductive moisture-curable resin composition contains the following components (A) to (C):
component (A): an organic polymer containing two or more hydrolyzable silyl groups;
component (B): a thermally conductive filler; and
component (C): a silicone compound having a polar group and/or a polar chain at a terminal or a side chain.

15 Claims, No Drawings

THERMALLY CONDUCTIVE MOISTURE-CURABLE RESIN COMPOSITION AND CURED PRODUCT THEREOF

CROSS REFERENCE TO RELATED APPLICATION

This Application is a 371 of PCT/JP2019/004007 filed on Feb. 5, 2019 which, in turn, claimed the priority of Japanese Patent Application No. 2018-024688 filed on Feb. 15, 2018, both applications are incorporated herein by reference.

TECHNICAL FIELD

The present invention relates to a thermally conductive moisture-curable resin composition and a cured product thereof.

BACKGROUND ART

In recent years, a thermally conductive resin composition has been disposed between a heat generator and a heat dissipation member such as a heat dissipation fin for the purpose of dissipating heat generated from electric and electronic components of electronic devices such as mobile phones and personal computers, illuminations such as LEDs to the outside, and the like. JP 2010-171129 A discloses a thermally conductive moisture-curable resin composition excellent in adhesiveness and thermal conductivity, in which an oligomer having a hydrolyzable silyl group is used.

SUMMARY OF INVENTION

It is required that a cured product of a thermally conductive moisture-curable resin composition be easily peeled off from a heat generator or a heat dissipator at the time of repairing or replacing electronic components.

However, the cured product of a thermally conductive moisture-curable resin composition disclosed in JP 2010-171129 A has adhesive strength, and is therefore poor in peelability.

Accordingly, the present invention has been made in view of the above-described circumstances, and an object of the present invention is to provide a thermally conductive moisture-curable resin composition which develops excellent thermal conductivity and peelability after curing.

The present invention has the following summary.

[1] A thermally conductive moisture-curable resin composition containing the following components (A) to (C):
component (A): an organic polymer containing two or more hydrolyzable silyl groups;
component (B): a thermally conductive filler; and
component (C): a silicone compound having a polar group and/or a polar chain at a terminal or a side chain.

[2] The thermally conductive moisture-curable resin composition according to [1], wherein the polar group of the component (C) is at least one or more selected from the group consisting of an amino group, a silanol group, a carbinol group and a carbonyl group, and the polar chain of the component (C) is at least one or more selected from the group consisting of a polyether chain, a polyester chain and a polythioether chain.

[3] The thermally conductive moisture-curable resin composition according to [1] or [2], wherein the component (C) has a polar group and/or a polar chain at a terminal.

[4] The thermally conductive moisture-curable resin composition according to any one of [1] to [3], wherein an amount of the component (C) added is 1 to 50 parts by mass based on 100 parts by mass of the component (A).

[5] The thermally conductive moisture-curable resin composition according to any one of [1] to [4], wherein an amount of the component (B) added is 55 to 95 mass % based on a total of the composition.

[6] The thermally conductive moisture-curable resin composition according to any one of [1] to [5], wherein the component (B) is thermally conductive powder of at least one or more selected from the group consisting of alumina, zinc oxide, magnesium oxide, aluminum nitride, boron nitride, carbon and diamond.

[7] The thermally conductive moisture-curable resin composition according to any one of [1] to [6], wherein a shape of the component (B) is a spherical shape or an indeterminate shape.

[8] The thermally conductive moisture-curable resin composition according to any one of [1] to [7], further containing a curing catalyst as a component (D).

[9] The thermally conductive moisture-curable resin composition according to any one of [1] to [8], further containing a silane compound having a hydrolyzable functional group as a component (E).

[10] The thermally conductive moisture-curable resin composition according to any one of [1] to [9], wherein the component (A) is at least one or more structure selected from the group consisting of a polyether main chain structure, a polyester main chain structure, a polycarbonate main chain structure, a polyurethane main chain structure, a polyamide main chain structure, a polyurea main chain structure, a polyimide main chain structure, and a vinyl-based polymer main chain structure obtained by polymerizing a polymerizable unsaturated group.

[11] A cured product obtained by curing the thermally conductive moisture-curable resin composition according to any one of [1] to [10].

[12] A joined body including the cured product according to [11] which is formed between a heat generator and a heat dissipator of an electric/electronic component so as to contact the heat generator and/or the heat dissipator, and the heat generator and/or the heat dissipator.

[13] A method for dissipating heat, including dissipating heat generated from an electric/electronic component to an outside through a cured product that forms a part of the joined body according to [12].

[14] A method for repairing and replacing an electric/electronic component, including peeling off a cured product from the joined body according to [12] before repairing and/or replacing an electric/electronic component, repairing and/or replacing the component, then applying a thermally conductive moisture-curable resin composition to a heat generator and/or a heat dissipator, and curing the thermally conductive moisture-curable resin composition to form a cured product between the heat generator and the heat dissipator to reconstruct a joined body.

DESCRIPTION OF EMBODIMENTS

Details of the present invention will be described below.
A thermally conductive moisture-curable resin composition of the present invention contains the following components (A) to (C):

component (A): an organic polymer containing two or more hydrolyzable silyl groups;
component (B): a thermally conductive filler; and
component (C): a silicone compound having a polar group and/or a polar chain at a terminal or a side chain.

The present invention provides a thermally conductive moisture-curable resin composition capable of developing excellent thermal conductivity and peelability after curing.

<Component (A)>

The organic polymer of the component (A) for use in the present invention is not particularly limited as long as it has two or more crosslinkable hydrolyzable silyl groups per molecule. In the component (A), the hydrolyzable silyl group is hydrolyzed to form a siloxane bond, whereby the organic polymer is crosslinked to form a cured product.

The hydrolyzable silyl group is a group in which 1 to 3 hydrolyzable groups are bonded to a silicon atom. Preferable examples of the hydrolyzable group include halogen atoms, alkoxy groups, acyloxime groups, ketoximate groups, amino groups, amide groups, aminooxy groups, alkenyloxide groups and the like, and alkoxy groups that do not generate harmful by-products in reaction are particularly preferable.

Examples of the alkoxy groups include a methoxy group, an ethoxy group, a propyloxy group, an isopropyloxy group, a butoxy group, a tert-butoxy group, a phenoxy group, a benzyloxy group and the like. Among them, a methoxy group and an ethoxy group are preferable from the viewpoint of developing peelability. These alkoxy groups may be the same, or may be different alkoxy groups combined.

Examples of the alkoxysilyl groups in which an alkoxy group is bonded to a silicon atom include trialkoxysilyl groups such as a trimethoxysilyl group, a triethoxysilyl group, a triisopropoxysilyl group, and a triphenoxysilyl group; dialkoxysilyl groups such as a methyldimethoxysilyl group, and a methyldiethoxysilyl group; and monoalkoxysilyl groups such as a dimethylmethoxysilyl group, and a dimethylethoxysilyl group. Among them, a dialkoxysilyl group and a trialkoxysilyl group are preferable from the viewpoint of developing peelability. A plurality of these groups may be used in combination.

The main chain structure of the component (A) is not particularly limited, and examples thereof include polyether main chain structures, polyester main chain structures, polycarbonate main chain structures, polyurethane main chain structures, polyamide main chain structures, polyurea main chain structures, polyimide main chain structures, vinyl-based polymer main chain structures obtained by polymerizing a polymerizable unsaturated group, and the like. The component (A) may have one of these main chain structures per molecule, or may have a main chain structure obtained by combining two or more of these main chain structures. In addition, the component (A) may be a mixture of two or more compounds having these structures. Among the main chain structures described above, at least one of the vinyl-based polymer main chain structure and the polyether main chain structure is particularly preferable from the viewpoint of developing peelability. That is, the main chain structure may be a vinyl-based polymer main chain structure or a polyether main chain structure, or may have both a polyether main chain structure moiety and a vinyl-based polymer main chain structure moiety.

Examples of the polyether main chain structure include main chain structures such as those of polyethylene glycol, polypropylene glycol, polytrimethylene glycol, polytetramethylene glycol and the like, copolymer structures thereof, and derivatives thereof having a substituent. Examples of commercially available polymers having a polyether main chain structure having a hydrolyzable silyl group include S-203, S-303, S-903 and the like as MS Polymer (trade name) and SAT-200, SAT-350, MA-403, MA-447 and the like as Silyl Polymer (registered trademark), which are manufactured by Kaneka Corporation; EXCESTAR (registered trademark) ESS-2410, ESS-2420, ESS-3630 and the like manufactured by AGC Inc.

Examples of the polyester main chain structure include polyester main chain structures obtained by condensing a glycol such as ethylene glycol, propylene glycol, neopentyl glycol or tetramethylene glycol with a dicarboxylic acid such as terephthalic acid, isophthalic acid, sebacic acid, succinic acid, phthalic acid or adipic acid.

Examples of the polyurethane main chain structure include polyurethane main chain structures and the like obtained by reacting a polyol such as polyether polyol, polyester polyol, castor oil-based polyol, hydrogenated castor oil-based polyol, polycarbonate polyol, polybutadiene polyol, polyisoprene polyol or hydrogenated polyisoprene polyol with a diisocyanate such as xylylene diisocyanate, isophorone diisocyanate, methylenediphenyl diisocyanate or toluylene diisocyanate.

Examples of the polyamide main chain structure include polyamide main chain structures obtained by condensation of a diamine and a dicarboxylic acid, or ring-opening polymerization of caprolactam. Examples of the polyurea main chain structure include polyurea main chain structures obtained by polyaddition of a diamine and a diisocyanate. Examples of the polyimide main chain structure include polyimide main chain structures obtained by imidizing a diamine and a compound having two cyclic acid anhydride structures per molecule.

In addition, the vinyl-based polymer obtained by polymerizing the polymerizable unsaturated group may be a polymer obtained by polymerizing a vinyl monomer, and examples thereof include polyethylene, polypropylene, polyisobutylene, poly(meth)acrylate, polystyrene, polyvinyl chloride, polyvinylidene chloride, polybutadiene, polyisoprene, polyvinyl acetate, polyvinyl alcohol, polyvinyl butyral, polyvinyl ether and the like. In addition, the vinyl-based polymer may be a copolymer having such a vinyl polymer moiety.

A suitable viscosity of the component (A) in the present invention at 23° C. is not particularly limited, and is, for example, in the range of 0.1 to 500 Pa·s, further preferably 1 to 100 Pa·s, particularly preferably 3 to 50 Pa·s. It is preferable that the viscosity is in the above-mentioned range because a thermally conductive moisture-curable resin composition having a low viscosity and having peelability after curing can be obtained.

<Component (B)>

The thermally conductive filler as the component (B) in the present invention is used for the purpose of imparting thermal conductivity to the thermally conductive moisture-curable resin composition. The component (B) is not particularly limited, and examples thereof include alumina, zinc oxide, magnesium oxide, aluminum nitride, boron nitride, carbon, diamond and the like from the viewpoint of excellent thermal conductivity, and in particular, alumina, aluminum nitride and boron nitride are preferable because of further excellent thermal conductivity. In addition, the component (B) may be one subjected to surface treatment. In addition, these materials may be used alone, or used in mixture.

An average particle diameter of the component (B) (50% average particle diameter) is preferably 0.01 μm or more and less than 150 μm, more preferably 0.1 μm or more and 50 μm or less, most preferably 0.5 μm or more and 30 μm or less, from the viewpoint of obtaining a thermally conductive moisture-curable resin composition having a low viscosity before curing. Note that, in the present invention, the average particle diameter is, for example, a particle diameter at cumulative 50% in a particle size distribution as determined by a laser diffraction scattering method. (also referred to as D50)

A content of the component (B) is not particularly limited, and is, for example, preferably 55 to 95 mass %, further preferably 60 to 90 mass %, particularly preferably 70 to 85 mass %, based on the total of the thermally conductive moisture-curable resin composition of the present invention. It is preferable that the content of the component (B) is within the above-mentioned range because a thermally conductive moisture-curable resin composition having a low viscosity and having peelability after curing can be obtained.

The thermally conductive filler of the component (B) is preferably thermally conductive powder, and the shape of the thermally conductive powder may be a spherical shape or an indeterminate shape from the viewpoint of obtaining a thermally conductive moisture-curable resin composition having high thermal conductivity and peelability after curing. The spherical thermally conductive powder in the present invention is not necessarily a perfectly spherical shape, and may be a shape such as a substantially spherical shape, an elliptic shape in terms of a cross-sectional shape, or the like. In addition, the indeterminate thermally conductive powder in the present invention refers to thermally conductive powder having a shape which is not a spherical shape and which has corners, and examples of the shape include needle shapes, fibrous shapes, scalelike shapes, dendritic shapes, flat-plate shapes, fragmental shapes and the like. Further, by combining spherical thermally conductive powder with indeterminate thermally conductive powder, a thermally conductive moisture-curable resin composition having higher thermal conductivity and peelability after curing can be obtained.

The component (B) is preferably a combination of two or more thermally conductive powders having different average particle diameters because a thermally conductive moisture-curable resin composition having a low viscosity and having thermal conductivity and peelability after curing can be obtained. Specifically, an average particle diameter of a component (B1), which is thermally conductive powder having a small average particle diameter, is preferably 0.01 μm or more and less than 2.0 μm, more preferably 0.1 μm or more and 1.8 μm or less. An average particle diameter of a component (B2) which is thermally conductive powder having a large average particle diameter, is preferably 2.0 μm or more and less than 150 μm, more preferably 2.5 μm or more and 100 μm or less, most preferably 2.7 μm or more and 70 μm or less, because a thermally conductive moisture-curable resin composition having a low viscosity before curing and excellent thermal conductivity after curing can be obtained. In addition, an amount of the component (B2) is 10 to 300 parts by mass, more preferably 20 to 150 parts by mass, particularly preferably 30 to 100 parts by mass, based on 100 parts by mass of the component (B1). It is preferable that the amounts of the components (B1) and (B2) added are within the above-mentioned ranges because a thermally conductive moisture-curable resin composition having a lower viscosity and having excellent thermal conductivity and peelability after curing can be obtained.

<Component (C)>

The component (C) in the present invention is not particularly limited as long as it is a silicone compound having a polar group and/or a polar chain at the terminal or the side chain. By combining the component (C) in the present invention with the components (A) and (B) which are other essential components, a remarkable effect is attained such that excellent releasability is exhibited while thermal conductivity is maintained after curing. Silicone oil which has a polar group and/or a polar chain at the terminal and which is a kind of silicone compound is preferable because of particularly excellent releasability. Examples of the polar group of the component (C) include an amino group, a silanol group, a carbinol group, a carbonyl group and the like from the viewpoint of obtaining a remarkable effect such that excellent releasability is exhibited while thermal conductivity is maintained after curing, and among them, an amino group and a carbinol group are preferable from the viewpoint of obtaining a remarkable effect such that excellent releasability is exhibited while thermal conductivity is maintained after curing. In addition, examples of the polar chain of the component (C) include polyether chains, polyester chains, polythioether chains and the like from the viewpoint of obtaining a remarkable effect such that excellent releasability is exhibited while thermal conductivity is maintained after curing, and among them, polyether chains are preferable from the viewpoint of obtaining a remarkable effect such that excellent releasability is exhibited while thermal conductivity is maintained after curing. Note that, when the component (C) is a silicone compound having a polar chain at the terminal or the side chain, the terminal group is not particularly limited, and examples thereof include a hydrogen atom, halogen atoms, a hydroxyl group, a carbinol group, linear or branched alkyl groups having 1 to 20 carbon atoms, aryl groups, alkoxy groups, a carboxy group, an aldehyde group, an amino group, a nitrile group, an amide group, a cyano group, a sulfone group, a nitro group, a thiol group, an isocyanate group and the like from the viewpoint of obtaining a remarkable effect such that excellent releasability is exhibited while thermal conductivity is maintained after curing. Among them, an amino group, a carbinol group, and a carbonyl group are preferable, and an amino group and a carbinol group are particularly preferable, from the viewpoint of obtaining a remarkable effect such that excellent releasability is exhibited while thermal conductivity is maintained after curing.

The commercial product of the component (C) is not particularly limited, and examples thereof include BY16-036, SH28PA, SF-8428, L-7001, FZ-2104 and L-7002 (each manufactured by Dow Corning Toray Co., Ltd.) as silicone compounds modified with polyether at the side chain; SF-8427 and BY16-201 (each manufactured by Dow Corning Toray Co., Ltd.) as silicone compounds having a carbinol group at the terminal; BY16-849, FZ-3785, and BY16-872 (each manufactured by Dow Corning Toray Co., Ltd.) as silicone compounds having an amino group at the side chain; BY 16-853U and BY 16-871 (each manufactured by Dow Corning Toray Co., Ltd.) as silicone compounds having an amino group at the terminal; and the like.

An amount of the component (C) added is preferably 1 to 50 parts by mass, further preferably 3 to 40 parts by mass, particularly preferably 5 to 30 parts by mass, based on 100 parts by mass of the component (A). It is preferable that the amounts of the component (C) added is within the above-mentioned ranges because a thermally conductive moisture-curable resin composition having a lower viscosity and having further excellent peelability after curing can be obtained.

<Component (D)>

The thermally conductive moisture-curable resin composition of the present invention may further contain a curing catalyst as a component (D) from the viewpoint of enabling adjustment of curability. The curing catalyst of the component (D) is not particularly limited as long as it is a catalyst for crosslinking the organic polymer of the component (A). Specific examples include tin compounds such as dibutyltin dilaurate, dibutyltin oxide, dibutyltin diacetate, dibutyltin distearate, dibutyltin laurate oxide, dibutyltin diacetylacetonate, dibutyltin dioleylmalate, dibutyltin octoate, dioctyltin oxide, dioctyltin dilaurate, and reaction products of a dioctyltin salt with a silicate; titanate-based compounds such as tetra-n-butoxy titanate, and tetraisopropoxy titanate; carboxylic acid metal salts; metal acetylacetonate complexes; amine salts; organic phosphoric acid compounds; and the like. Among them, tin compounds and titanate-based compounds are preferable from the viewpoint of curability and peelability. These compounds may be used alone, or used in combination of two or more thereof.

An amount of the component (D) added is not particularly limited, and is, for example, 0.1 to 100 parts by mass, further preferably 1 to 50 parts by mass, particularly preferably 3 to 30 parts by mass, based on 100 parts by mass of the component (A). It is preferable that the viscosity is in the above-mentioned range because a thermally conductive moisture-curable resin composition having further excellent thermal conductivity and peelability after curing can be obtained.

<Component (E)>

The thermally conductive moisture-curable resin composition of the present invention may further contain a silane compound having a hydrolyzable functional group as a component (E) from the viewpoint of obtaining a thermally conductive moisture-curable resin composition having excellent thermal conductivity and peelability after curing. The silane compound having a hydrolyzable silyl group, which is the component (E), is not particularly limited, and examples thereof include silicate compounds typified by methyl silicate, ethyl silicate, propyl silicate and butyl silicate; silane coupling agents having an alkyl group, such as dimethyldimethoxysilane, methyltrimethoxysilane, methyltriethoxysilane, dimethyldiethoxysilane, and hexyltrimethoxysilane; vinyl group-containing silane coupling agents such as vinyltrimethoxysilane, and vinyltriethoxysilane; silane coupling agents having a phenyl group, such as phenyltrimethoxysilane, diphenyldimethoxysilane, and phenyltriethoxysilane; silane coupling agents having an amino group, such as N-2-(aminoethyl)-3-aminopropyltrimethoxysilane, N-2-(aminoethyl)-3-aminopropylmethyldimethoxysilane, N-2-(aminoethyl)-3-aminopropylmethyltrimethoxysilane, N-2-(aminoethyl)-3-aminopropylmethyltriethoxysilane, 3-aminopropyltrimethoxysilane, 3-aminopropyltriethoxysilane, and N-phenyl-3-aminopropyltrimethoxysilane; silane coupling agents having a glycidyl group, such as 3-glycidoxypropylmethyldimethoxysilane, 3-glycidoxypropyltrimethoxysilane, and 3-glycidoxysilyltriethoxysilane; and silane coupling agents having a (meth)acryloyl group, such as 3-(meth)acryloxypropylmethyldimethoxysilane, 3-(meth)acryloxypropyltrimethoxysilane, 3-(meth)acryloxypropylmethyldiethoxysilane, 3-(meth)acryloxypropyltriethoxysilane. Among them, silicate compounds, silane coupling agents having an alkyl group, and vinyl group-containing silane coupling agents are preferable from the viewpoint of attaining both moisture curability and storage stability. These compounds may be used alone, or used in combination of two or more thereof.

An amount of the component (E) added is not particularly limited, and is, for example, 0.1 to 150 parts by mass, further preferably 1 to 70 parts by mass, particularly preferably 3 to 50 parts by mass, based on 100 parts by mass of the component (A). It is preferable that the viscosity is in the above-mentioned range because a thermally conductive moisture-curable resin composition having a lower viscosity and having excellent thermal conductivity and peelability after curing can be obtained.

<Optional Additives>

In addition, in the present invention, the thermally conductive moisture-curable resin composition may further contain optional additives in addition to the components (D) and (E) as long as the properties of the thermally conductive moisture-curable resin composition are not impaired. Examples of the optional additives include surfactants such as stabilizers, plasticizers, solvents, dispersants, leveling agents, wetting agents, and defoaming agents, antiaging agents such as antistatic agents, surface lubricants, antirust agents, antiseptic agents, viscoelasticity adjusting agents, rheology adjusting agent, colorants, and ultraviolet absorbers, fillers that are not thermally conductive, and the like.

Further, the thermally conductive moisture-curable resin composition of the present invention may contain a polymeric material having no hydrolyzable silyl group, such as a polyester resin, a polycarbonate resin, a polyacrylic resin, a polyurethane resin, and a polyvinyl resin for the purpose of adjusting viscoelasticity, or the like.

Examples of the filler that is not thermally conductive include organic or inorganic fillers having various shapes, and inorganic substances such as talc, silica, clay, calcium carbonate, magnesium carbonate, calcium silicate, shirasu balloon, and glass balloon are preferable. When such an inorganic substance is added, flame retardancy and workability may be improved in some cases.

The thermally conductive moisture-curable resin composition of the present invention can be produced by a known method. The thermally conductive moisture-curable resin composition can be produced by, for example, mixing predetermined amounts of the components (A) to (E) and stirring the mixture using a mixing unit such as a mixer at a temperature of preferably 10 to 70° C. preferably for 0.1 to 5 hours.

<Use Purposes>

The thermally conductive moisture-curable resin composition of the present invention has excellent peelability and thermal conductivity after curing, and therefore can be used for various purposes such as heat dissipation from electronic boards, heat dissipation from electronic devices such as mobile phones, and personal computers, heat dissipation from lighting systems such as LEDs, heat dissipation from optical pickup modules, heat dissipation from camera modules, heat dissipation from power semiconductors, heat dissipation from inverters for HEV, FCV and EV, heat dissipation from converters for HEV, FCV and EV, and heat dissipation from ECU components for HEV, FCV and EV.

<Cured Product>

The cured product of the present invention is one obtained by curing the thermally conductive moisture-curable resin composition of the present invention. It is preferable that the cured product of the present invention is used between a heat generator and a heat dissipator of an electric/electronic component. In this case, by applying and curing the thermally conductive moisture-curable resin composition excellent in adhesiveness according to the present invention, a cured product bonded to the heat generator and/or the heat dissipator can be obtained. During operation of the electric/electronic component, heat generated from the component can be efficiently dissipated to the outside through the cured product excellent in thermal conductivity. Further, at the time of repairing or replacing the electric/electronic component, the cured product excellent in peelability can be easily peeled off from the heat generator and the heat dissipator.

<Joined Body>

The joined body of the present invention includes a heat generator and/or a heat dissipator of an electric/electronic component, and the cured product of the present invention which is formed between the heat generator and the heat dissipator so as to contact the heat generator and/or the heat dissipator. The joined body of the present invention can be obtained by applying the thermally conductive moisture-curable resin composition of the present invention to a heat generator and/or a heat dissipator of an electric/electronic component, and curing the thermally conductive moisture-curable resin composition. The joined body thus obtained has a structure in which the heat generator and the heat dissipator are bonded to each other with the cured product interposed therebetween. Thus, during the operation of the electric/electronic component, heat generated from the electric/electronic component can be efficiently dissipated to the outside through the cured product forming the joined body and having excellent thermal conductivity. Further, at the time of repairing or replacing the electric/electronic component, the cured product excellent in peelability can be easily peeled off from the joined body, so that the electric/electronic component can be easily repaired or replaced. Further, after repair or replacement, the thermally conductive moisture-curable resin composition of the present invention can be applied to the heat generator and/or the heat dissipator, and cured to form a cured product between the heat generator and the heat dissipator to reconstruct a joined body. The joined body can be easily replaced by a new joined body along with repair or replacement of the electric/electronic component. Thus, even after repair or replacement of the electric/electronic component, heat generated from the electric/electronic component can be efficiently dissipated to the outside owing to the excellent thermal conductivity of the cured product forming the reconstructed joined body or the new joined body.

<Method for Dissipating Heat>

The method for dissipating heat according to the present invention is, for example, a method including dissipating heat generated from an electric/electronic component to the outside through a cured product forming the joined body according to the present invention, and the like. In the method for dissipating heat according to the present invention, heat generated from an electric/electronic component is dissipated to the outside through the cured product forming the joined body and having excellent thermal conductivity, and thus heat dissipation efficiency can be improved, so that heat generated from the electric/electronic component can be effectively inhibited from staying inside. Examples of the electric/electronic components include electronic boards, electronic devices such as mobile phones, and personal computers, lighting devices such as LEDs, optical pickup modules, camera modules, power semiconductors, inverters for HEV, FCV and EV, converters for HEV, FCV and EV, ECU components for HEV, FCV and EV, and the like.

<Method for Repairing and Replacing Electric/Electronic Component>

The method for repairing and replacing an electric/electronic component includes peeling off a cured product from the joined body of the present invention before repairing and/or replacing an electric/electronic component, repairing and/or replacing the component, then applying a thermally conductive moisture-curable resin composition to a heat generator and/or a heat dissipator, and curing the thermally conductive moisture-curable resin composition to form a cured product between the heat generator and the heat dissipator to reconstruct a joined body. The method for repairing and replacing an electric/electronic component according to the present invention ensures that at the time of repairing or replacing the electric/electronic component, the cured product excellent in peelability can be easily peeled off from the joined body, so that the electric/electronic component can be easily repaired or replaced. Further, after repair or replacement, the thermally conductive moisture-curable resin composition of the present invention can be applied to the heat generator and/or the heat dissipator, and cured to form a cured product between the heat generator and the heat dissipator to reconstruct a joined body. Thus, even after repair or replacement of the electric/electronic component, heat generated from the electric/electronic component can be efficiently dissipated to the outside owing to the excellent thermal conductivity of the cured product forming the reconstructed joined body.

EXAMPLES

Hereinafter, the present invention will be described in detail by way of examples, which should not be construed as limiting the present invention.

<Preparation of Thermally Conductive Moisture-Curable Resin Composition>

Each component was taken in an amount as shown in terms of the number of parts by mass in Table 1, the components were mixed with a planetary mixer at room temperature for 60 minutes to prepare a thermally conductive moisture-curable resin composition, and various physical properties were measured as follows.

<Component (A)>
- a1: Polyether having a viscosity of 6 Pa·s at 23° C. and having a methyldimethoxysilyl group at both ends (Kaneka Silyl SAT 350 manufactured by Kaneka Corporation)
- a2: Polyether having a viscosity of 25 Pa·s at 23° C. and having a methyldimethoxysilyl group at both ends (Kaneka Silyl SAT 200 manufactured by Kaneka Corporation)

<Component (B)>
- b1: Amorphous alumina powder having an average particle diameter of 1.0 μm (manufactured by Showa Denko K.K.)
- b2: Spherical alumina powder having an average particle diameter of 3.0 μm (manufactured by NIPPON STEEL & SUMIKIN MATERIALS CO., LTD.)

<Component (C)>
- c1: Silicone compound modified with polyether at the side chain (SH28 manufactured by Dow Corning Toray Co., Ltd.)
- c2: Silicone compound having a carbinol group at both ends (SF-8427 manufactured by Dow Corning Toray Co., Ltd.)

c3: Silicone compound modified with an amino group at the side chain (BY16-849 manufactured by Dow Corning Toray Co., Ltd.)

<Comparative Component to Component (C)> c'1: Silicone compound having an alkyl group at the side chain (BY16-846 manufactured by Dow Corning Toray Co., Ltd.)

c'2: Non-modified silicone compound (SH200 manufactured by Dow Corning Toray Co., Ltd.)

<Component (D)> d1: Reaction product of dioctyltin salt and silicate (NEO-STANN (registered trademark) S-1 manufactured by Nitto Kasei Co., Ltd.)

d2: Titanium diisopropoxybis(ethyl acetoacetate) (TC-750 manufactured by Matsumoto Fine Chemical Co., Ltd.)

<Component (E)> e1: Hexyltrimethoxysilane (KBM-3063 manufactured by Shin-Etsu Chemical Co., Ltd.).

The test methods used in examples and comparative examples are as follows.

<Peelability Test>

5 g of the thermally conductive moisture-curable resin composition of each of examples and comparative examples in Table 1 was applied onto an aluminum test piece having a width of 25 mm, a length of 100 mm and a thickness of 1 mm, and left standing at 23° C. and 50% RH for 3 days to be cured. Thus, a specimen was obtained. Subsequently, the specimen was subjected to a peeling operation, and a visual observation was made to determine whether cohesive fracture did not occur at the bonding interface and whether interfacial peeling did not occur in the cured product of the thermally conductive moisture-curable resin composition.

The peeling operation includes inserting the tip of a toothpick at the interface between the aluminum test piece as the specimen and the cured product of the thermally conductive moisture-curable resin composition, and applying a load to peel off the cured product of the thermally conductive moisture-curable resin composition from the aluminum test piece. Evaluation was performed on the basis of the following criteria. The results are shown in Table 1. Note that, in particular, in Examples 3 and 4, it was possible to peel off the cured product of the thermally conductive moisture-curable resin composition from the aluminum test piece with a small load, and thus, particularly good peelability was exhibited.

—Evaluation Criteria—

OK: Interfacial peeling occurred at the bonding interface.

NG: Cohesive fracture occurred at the bonding interface. Alternatively, the cured product of the thermally conductive moisture-curable resin composition was not peeled off, and was broken at the time of performing the peeling operation.

<Measurement of Thermal Conductivity>

The thermally conductive moisture-curable resin composition of each of examples and comparative examples in Table 1 was applied to a thickness of 0.5 mm, and left standing in an environment at 23° C. and 50% RH for 7 days to be cured to prepare a specimen.

In measurement of the thermal conductivity, the thermal conductivity (W/m·k) was measured at 25° C. using a thermal conductivity meter (QTM-500 manufactured by Kyoto Electronics Manufacturing Co., Ltd.). The thermal conductivity is preferably as high as possible because heat can be easily transmitted. Particularly, in the present invention, the thermal conductivity is preferably 1.0 (W/m·k) or more.

TABLE 1

| Component | Example 1 | Example 2 | Example 3 | Example 4 | Example 5 | Example 6 | Example 7 | Example 8 | Comparative Example 1 | Comparative Example 2 | Comparative Example 3 | Comparative Example 4 | Comparative Example 5 |
|---|---|---|---|---|---|---|---|---|---|---|---|---|---|
| a1 | 100 | 100 | 100 | 100 | 100 | 100 | 100 | | 100 | 100 | 100 | 100 | 100 |
| a2 | | | | | | | | 100 | | | | | |
| b1 | 360 | 360 | 360 | 360 | 360 | 360 | 360 | 360 | 360 | 360 | 360 | 360 | 360 |
| b2 | 220 | 220 | 220 | 220 | 220 | 220 | 220 | 220 | 220 | 220 | 220 | 220 | 220 |
| c1 | 7 | 21 | | | | | 21 | | 0 | | | | |
| c2 | | | 7 | 21 | | | | 7 | | | | | |
| c3 | | | | | 7 | 21 | | | | | | | |
| c'1 | | | | | | | | | | 7 | 21 | | |
| c'2 | | | | | | | | | | | | 7 | 21 |
| d1 | 7 | 7 | 7 | 7 | 7 | 7 | | 7 | 7 | 7 | 7 | 7 | 7 |
| d2 | | | | | | | 7 | | | | | | |
| e1 | 11 | 11 | 11 | 11 | 11 | 11 | 11 | 11 | 11 | 11 | 11 | 11 | 11 |
| Ratio of component (B) to the total of composition wt % | 83.6 | 81.9 | 83.6 | 81.9 | 83.6 | 81.9 | 81.9 | 83.6 | 84.4 | 83.6 | 81.9 | 83.6 | 81.9 |
| Peelability | OK | OK | OK | OK | OK | OK | OK | OK | NG | NG | NG | NG | NG |
| Thermal conductivity W/mk | 1.4 | 1.3 | 1.4 | 1.3 | 1.3 | 1.2 | 1.1 | 1.3 | 1.5 | 1.3 | 1.2 | 1.3 | 1.2 |

Among columns for the components in Examples and Comparative examples in Table 1, blank columns in which values are not written show that components concerned are not present.

The results of Examples 1 to 8 in Table 1 show that the cured product of the thermally conductive moisture-curable resin composition of the present invention was excellent in peelability and thermal conductivity. In particular, in Examples 3 and 4, it was possible to peel off the cured product of the thermally conductive moisture-curable resin composition from the aluminum test piece with a small load, and good peelability was exhibited. On the other hand, Comparative Example 1 in which the component (C) in the present invention was not present showed poor peelability. Comparative Examples 2 to 5 in which components c'1 and c'2 were present instead of the component (C) in the present invention showed poor peelability.

INDUSTRIAL APPLICABILITY

The thermally conductive moisture-curable resin composition of the present invention exhibits excellent peelability and thermal conductivity after curing, is therefore extremely effective, and the thermally conductive moisture-curable resin composition is applicable to a wide range of fields for the purpose of heat dissipation from electronic components, and the like, and is therefore industrially useful.

The invention claimed is:

1. A thermally conductive moisture-curable resin composition comprising the following components (A) to (C):
   component (A): an organic polymer containing two or more hydrolyzable silyl groups;
   component (B): a first thermally conductive filler (B1) and a second thermally conductive filler (B2); and
   component (C): a silicone compound having a polar group and/or a polar chain at a terminal or a side chain,
   wherein an amount of the component (C) added is 1 to 50 parts by mass based on 100 parts by mass of the component (A),
   the first and second thermally conductive fillers (B1) and (B2) are selected from the group consisting of alumina, zinc oxide, magnesium oxide, aluminum nitride, boron nitride, carbon, and diamond,
   the first thermally conductive filler (B1) has an average particle diameter of 0.01 μm or more and less than 2.0 μm,
   the second thermally conductive filler (B2) has an average particle diameter of 2.0 μm or more and less than 150 μm,
   an amount of the second thermally conductive filler (B2) is 10 to 300 parts by mass, based on 100 parts by mass of the first thermally conductive filler (B1), and
   the composition does not include silica.

2. The thermally conductive moisture-curable resin composition according to claim 1, wherein the polar group of the component (C) is at least one or more selected from the group consisting of an amino group, a silanol group, a carbinol group and a carbonyl group, and
   the polar chain of the component (C) is at least one or more selected from the group consisting of a polyether chain, a polyester chain and a polythioether chain.

3. The thermally conductive moisture-curable resin composition according to claim 1, wherein the component (C) has a polar group and/or a polar chain at a terminal.

4. The thermally conductive moisture-curable resin composition according to claim 1, wherein an amount of the component (B) added is 55 to 95 mass % based on a total of the composition.

5. The thermally conductive moisture-curable resin composition according to claim 1, wherein a shape of the component (B) is a spherical shape or a shape which is not a spherical shape and which has corners.

6. The thermally conductive moisture-curable resin composition according to claim 1, further comprising a curing catalyst as a component (D).

7. The thermally conductive moisture-curable resin composition according to claim 1, further comprising a silane compound having a hydrolyzable functional group as a component (E).

8. The thermally conductive moisture-curable resin composition according to claim 1, wherein the component (A) is at least one or more structure selected from the group consisting of a polyether main chain structure, a polyester main chain structure, a polycarbonate main chain structure, a polyurethane main chain structure, a polyamide main chain structure, a polyurea main chain structure, a polyimide main chain structure, and a vinyl-based polymer main chain structure obtained by polymerizing a polymerizable unsaturated group.

9. A cured product obtained by curing the thermally conductive moisture-curable resin composition according to claim 1.

10. A joined body comprising the cured product according to claim 9 which is formed between a heat generator and a heat dissipator of an electric/electronic component so as to contact the heat generator and/or the heat dissipator, and the heat generator and/or the heat dissipator.

11. A method for dissipating heat, comprising dissipating heat generated from an electric/electronic component to an outside through a cured product that forms a part of the joined body according to claim 10.

12. A method for repairing and replacing an electric/electronic component, comprising peeling off a cured product from the joined body according to claim 10 before repairing and/or replacing an electric/electronic component, repairing and/or replacing the component, then applying a thermally conductive moisture-curable resin composition to a heat generator and/or a heat dissipator, and curing the thermally conductive moisture-curable resin composition to form a cured product between the heat generator and the heat dissipator to reconstruct a joined body.

13. The thermally conductive moisture-curable resin composition according to claim 1, wherein the silicone compound is a silicone oil having the polar group and/or the polar chain at the terminal or the side chain,
   the polar group is at least one group selected from the group consisting of an amino group, a carbinol group, and a carbonyl group, and
   the polar chain is at least one chain selected from the group consisting of a polyether chain, a polyester chain, and a polythioether chain.

14. The conductive moisture-curable resin composition according to claim 1, wherein an amount of the component (B) is 81.9 to 95 mass % based on a total of the composition.

15. The conductive moisture-curable resin composition according to claim 1, further comprising:
   component (D): a reaction product of a dioctyltin salt with a silicate as a curing catalyst.

* * * * *